United States Patent

Saito et al.

(10) Patent No.: US 10,090,460 B2
(45) Date of Patent: Oct. 2, 2018

(54) CRYSTAL ORIENTATION LAYER LAMINATED STRUCTURE, ELECTRONIC MEMORY AND METHOD FOR MANUFACTURING CRYSTAL ORIENTATION LAYER LAMINATED STRUCTURE

(71) Applicant: National Institute of Advanced Industrial Science and Technology, Tokyo (JP)

(72) Inventors: Yuta Saito, Tsukuba (JP); Junji Tominaga, Tsukuba (JP); Reiko Kondo, Tsukuba (JP)

(73) Assignee: National Institute of Advanced Industrial Science & Technology, Tokyo (JP)

( * ) Notice: Subject to any disclaimer, the term of this patent is extended or adjusted under 35 U.S.C. 154(b) by 0 days.

(21) Appl. No.: 15/349,074

(22) Filed: Nov. 11, 2016

(65) Prior Publication Data

US 2017/0062711 A1    Mar. 2, 2017

Related U.S. Application Data

(63) Continuation-in-part of application No. PCT/JP2015/062375, filed on Apr. 23, 2015.

(30) Foreign Application Priority Data

May 12, 2014  (JP) .................................. 2014-098415

(51) Int. Cl.
*H01L 29/49* (2006.01)
*H01L 45/00* (2006.01)
(Continued)

(52) U.S. Cl.
CPC .............. *H01L 45/06* (2013.01); *C23C 14/34* (2013.01); *C30B 23/025* (2013.01); *C30B 29/46* (2013.01);
(Continued)

(58) Field of Classification Search
CPC .................................................. G11B 7/24038
See application file for complete search history.

(56) References Cited

U.S. PATENT DOCUMENTS 8,685,518 B2 * 4/2014 Kojima .............. G11B 7/24035
428/64.1
2006/0266992 A1 11/2006 Matsui et al.
(Continued)

FOREIGN PATENT DOCUMENTS

EP      1 942 534 A2    7/2008
JP      2010-263131 A   11/2010
(Continued)

OTHER PUBLICATIONS

International Search Report for PCT Serial No. PCT/JP2015/062375 dated Jul. 13, 2015.
(Continued)

*Primary Examiner* — Michael Shingleton
(74) *Attorney, Agent, or Firm* — McCormick, Paulding & Huber LLP

(57) ABSTRACT

A crystal orientation layer laminated structure capable of widely selecting materials for a base substrate and an electrode substrate, an electronic memory using the crystal orientation layer laminated structure and a method for manufacturing the crystal orientation layer laminated structure are provided. The crystal orientation layer laminated structure according to the present invention has such a feature as including a substrate, including an orientation control layer which is laminated on the substrate, which is (Continued)

made of any of germanium, silicon, tungsten, germanium-silicon, germanium-tungsten and silicon-tungsten, and whose thickness is at least 1 nm or more, and including a first crystal orientation layer which is laminated on the orientation control layer, which is made of any of SbTe, $Sb_2Te_3$, BiTe, $Bi_2Te_3$, BiSe and $Bi_2Se_3$ as a main component, and which is oriented in a certain crystal orientation.

8 Claims, 7 Drawing Sheets

(51) Int. Cl.

| | | |
|---|---|---|
| H01L 27/105 | (2006.01) | |
| H01L 29/82 | (2006.01) | |
| C23C 14/34 | (2006.01) | |
| C30B 23/02 | (2006.01) | |
| C30B 29/46 | (2006.01) | |
| C30B 29/68 | (2006.01) | |
| G11C 11/16 | (2006.01) | |

(52) U.S. Cl.
CPC ............ *C30B 29/68* (2013.01); *G11C 11/161* (2013.01); *H01L 27/105* (2013.01); *H01L 29/82* (2013.01); *H01L 45/143* (2013.01); *H01L 45/144* (2013.01); *H01L 45/1625* (2013.01)

(56) References Cited

U.S. PATENT DOCUMENTS

| | | | |
|---|---|---|---|
| 2009/0130365 A1* | 5/2009 | Kojima | G11B 7/24038 428/64.4 |
| 2010/0200828 A1 | 8/2010 | Tominaga et al. | |
| 2010/0284218 A1 | 11/2010 | Aizawa et al. | |
| 2011/0207284 A1 | 8/2011 | Tominaga et al. | |

FOREIGN PATENT DOCUMENTS

| | | |
|---|---|---|
| JP | 4621897 B2 | 1/2011 |
| JP | 4635236 B2 | 2/2011 |
| JP | 2011-91433 A | 5/2011 |
| TW | 201336051 A | 9/2013 |
| WO | 2013125101 A1 | 8/2013 |

OTHER PUBLICATIONS

Zhang H. et al., Topological insulators in Bi2Se3, Bi2Te3 and Sb2Te3 with a single Dirac cone on the surface, Nature Physics, May 10, 2009, vol. 5, p. 438-442.

Xia Y. et al., Observation of a large-gap topological-insulator class with a single Dirac cone on the surface, Nature Physics, May 10, 2009, vol. 5, p. 398-402.

Tominaga J. et al., Interfacial phase-change memory, Nature Nanotechnology, Jul. 3, 2011, vol. 6, p. 1-5.

Tominaga J. et al., Electrical-field induced giant magnetoresistivity in (non-magnetic) phase change films, Applied Physics Letters, Oct. 11, 2011, vol. 99, p. 152105-1 to 152105-3.

Simpson R.E. et al., Enhanced crystallization of GeTe from an Sb2Te3 template, Applied Physics Letters, Jan. 12, 2012, vol. 100, p. 021911-1 to 021911-4.

Ghafouri, Bismuth Telluride and Antimony Telluride Based Co-evaporated Thermoelectric Thin Films: Technology, Characterization, and Optimization, Jan. 1, 2012, p. 60-61.

Panthani et al., Nanocrystals for Electronics, Annual review of Chemical and Biomolecular Engineering, Jul. 15, 2012, vol. 3, No. 1, p. 287-311.

Ghafouri, N., "Bismuth Telluride and Antimony Telluride Based Co-evaporated Thermoelectric Thin Films: Technology, Characterization, and Optimization," a dissertation submitted in partial fulfillment of the requirements for the degree of Doctor of Philosophy at the University of Michigan, pp. 1-173 (2012).

* cited by examiner

CRYSTAL ORIENTATION LAYER LAMINATED STRUCTURE, ELECTRONIC MEMORY AND METHOD FOR MANUFACTURING CRYSTAL ORIENTATION LAYER LAMINATED STRUCTURE

CROSS REFERENCE TO RELATED APPLICATIONS

The present application is a continuation-in-part application and claims priority from International Patent Application Serial No. PCT/JP2015/062375 filed Apr. 23, 2015 and Japanese Patent Application No. 2014-098415 filed on May 12, 2014, the contents of which are hereby incorporated by reference into this application.

TECHNICAL FIELD

The present invention relates to a crystal orientation layer laminated structure in which a superlattice structure configured of a crystal layer having a controlled orientation can be formed, an electronic memory using the crystal orientation layer laminated structure, and a method for manufacturing the crystal orientation layer laminated structure.

BACKGROUND ART

Computers which support the modern civilization are operated by an electric current which is a flow of electrons. Devices which are applied to information record and erasure by control of this electric current are configured by semiconductors. The electrons flowing through the semiconductors are scattered by impurities and Coulomb's force to generate Joule heat.

For this reason, a cooling fan is required for the computer. Moreover, some of the input energy cannot be used for the information record and erasure because of the Joule heat, and an energy loss is caused. That is, there is no doubt that suppression of the scattering of electrons is a main technical development issue aiming at power saving of the electronic device.

Conventionally, one of solutions is a method of operating the electronic device at an extremely low temperature for suppressing the scattering of the electrons. For example, use of a superconductor corresponds to this method. Since the electron scattering becomes zero in the superconductor, neither electric resistance nor Joule heat is generated. Therefore, the electron scattering does not occur.

However, when this method is used, it is required to cool the electronic device down to several degrees of Kelvin, and therefore, the energy to be consumed for this cooling should be noted. Moreover, it is difficult to commonalize and practically use such an electronic device as using the extremely-low-temperature state. For this reason, there is a situation without acceptable means that can suppress the electron scattering at room temperature.

However, the situation has been changed since about 2007. This is because a theoretical model of a topological insulator has been proposed as a theory of physics. The topological insulator is an insulator holding a specific electron state occurring on a material surface or an interface thereof, and is explained based on a relativistic effect caused by motions of inner-shell electrons of an element having a speed close to the speed of light. The effect becomes larger with atomic number.

That is, by this feature of electrons (spin-orbit interaction), a term of the spin-orbit interaction cannot be neglected, and added to the Hamiltonian of the band structure formed by the electrons, so that the band structure and the energy eigen value are changed. At this time, in a specific material, the valence band top and conduction band bottom are coupled with each other, generating a conduction band at the surface with vacuum (or the interface with a normal insulator). On the other hand, inside the material, a band gap is formed in some cases.

As a result, an unusual physical property which has not been conventionally known is expected, the unusual physical property causing a conductor on the surface or the interface of the material while causing an insulator inside the material because of the presence of the band gap. A material having such a property is referred to as "topological insulator" (see Non-Patent Document 1).

The specific electron band structures of the topological insulator have such curious characteristics that electrons existing on the surface or interface of the material are degenerated with two different electron spin currents preserving the spin states by time-reversal symmetry. In other words, this means that the electron band structures have such a specific property as not causing the electron scattering by the impurities or others. Moreover, for example, if there is no such external magnetic field as disturbing the time-reversal symmetry, this property is preserved very tightly. Note that the naming of the topological insulator is derived from the fact that this property of the electron band structures has a nature similar to that of the topology polyhedral theory of mathematics (see Non-Patent Document 1).

Since the theoretical prediction of the presence of the topological insulator, the research for a material having this curious property has actually been started. As a result, a bismuth-tellurium alloy, an antimony-tellurium alloy and others having high crystallinity have been verified by experiments using a photoelectron spectroscopy. However, the single crystals of these materials used in the experiments are produced by a very slowly cooling from a molten alloy or others, and therefore, cannot be directly applied to the electronic device (see Non-Patent Document 2) in production.

Meanwhile, without any relation to the above-described topological insulator, in order to reduce power consumption of a phase-change solid-state memory, the present inventors have proposed a superlattice-type phase-change solid-state memory whose memory operation is achieved by forming a superlattice-type phase-change film obtained by laminating a crystal alloy layer made of germanium-tellurium and a crystal alloy layer made of antimony-tellurium so that the (111) crystal orientation plane axes and the c-axes of the respective crystal alloy layers are matched with each other, and by switching an arrangement structure of germanium atoms toward a crystal growth axis direction (see Patent Documents 1 and 2 and Non-Patent Document 1).

The present inventors have found out that this superlattice-type phase-change solid-state memory can be an ideal topological insulator. This is because, as shown in Non-Patent Document 1, while a crystal alloy layer ($Sb_2Te_3$ crystal alloy layer) having an antimony-tellurium atomic ratio of 2:3 is used for the topological insulator, a structure of arrangement of a plurality of the crystal alloy layers is just used for a recording layer of the superlattice-type phase-change solid-state memory in the proposal of the present inventors, the plurality of the crystal alloy layers being separated from each other by a crystal alloy layer (GeTe crystal alloy layer) having a germanium-tellurium atomic ratio of 1:1 with a band gap. However, it only should be verified whether or not the crystal alloy layer made of germanium and tellurium has the same function as that of the vacuum band. And, by a first principle calculation using quantum mechanics, it has been verified that this crystal alloy layer plays the same role as that of the vacuum band through simulations (see Patent Document 3).

According to the verification, at a certain point (gamma point) within the reciprocal lattice space, the conduction band bottom and the valence band top cross each other at one point so as to be made in contact with each other in the vicinity of Fermi band level with a Dirac cone. This phenomenon is a unique property of the topological insulator, and this gamma point just becomes a central symmetric point of the GeTe/$Sb_2Te_3$ superlattice. That is, it has been verified that this GeTe layers become non-scattering layers of the electrons where the electrons can be freely two-dimensionally moved in the superlattice (see Patent Document 3).

The present inventors have executed the above-described first principle calculations while changing the number of blocks of the GeTe crystal alloy layer (one block number is about 1 nm) and the number of blocks of the $Sb_2Te_3$ crystal alloy layer arranged above and below the GeTe crystal alloy layer, and then, have succeeded in actually manufacturing an artificial superlattice structure based on the calculation results using a sputtering apparatus (see Non-Patent Document 3).

Moreover, it has been verified that, when an external magnetic field is applied to a memory device having this superlattice structure, a very large magnetoresistance effect is caused at room temperature (see Non-Patent Document 4). This unique phenomenon is caused based on a Rashba effect of the superlattice structure by breaking the spatial inversion symmetry when electric field is applied for memory switching, and this Rashba effect is surprisingly larger than that of any magnetic material that has been conventionally known, and an energy difference in spin bands caused by the superlattice structure reaches as much as 200 eV. The magnetic resistance effect is as large as being capable of observing the difference in spin characteristics at room temperature (see Non-Patent Literature 4).

Furthermore, various types of the superlattice structures each having a different thickness of the $Sb_2Te_3$ crystal alloy layer are formed on silicon wafers, and a change in the electron spin density which is induced by applying an external magnetic field to these superlattice structures in a direction perpendicular a surface is measured as a change in reflectance by allowing circular polarized light to be incident thereto, and, as a result, it is verified that the Rashba effect is remarkably enhanced in the case of the $Sb_2Te_3$ crystal alloy layer having a thickness thinner than 2 nm, and that the difference in the reflectance caused by the spin splitting becomes smaller in the case of the thickness thicker than this value. In other words, it is concluded that the superlattice-type phase-change film having a thickness larger than this value has a small Rashba effect, and becomes the topological insulator (see Patent Document 3).

Incidentally, in order to effectively generate such electric and magnetic characteristics of the superlattice structure, it is required to grow and orient the crystal alloy layer made of $Sb_2Te_3$ or others and the crystal alloy layer made of GeTe or others while maintaining a common crystal axis.

As a method for obtaining the above-described oriented growth, a method of arranging an orientation control layer made of $Sb_2Te_3$ as a base of the superlattice structure has been proposed (see, for example, Patent Document 4 and Non-Patent Document 5). Moreover, a desirable temperature condition for forming the superlattice structure having the orientation control layer as the base has been proposed (see Non-Patent Document 5).

RELATED ART DOCUMENTS

Patent Documents

Patent Document 1: Japanese Patent No. 4621897
Patent Document 2: Japanese Patent No. 4635236
Patent Document 3: International Publication WO/2013/125101
Patent Document 4: Japanese Patent Application Laid-open Publication No. 2010-263131

Non-Patent Documents

Non-Patent Document 1: H. Zhang et al., Nature Physics, 5, 438 (2009).
Non-Patent Document 2: Y. Xia et al., Nature Physics, 5, 398 (2009).
Non-Patent Document 3: J. Tominaga et al., Nature Nanotechnology, 6, 501 (2011).
Non-Patent Document 4: J. Tominaga et al., Applied Physics Letter, 99, 152105 (2011)
Non-Patent Document 5: R. E. Simpson et al., Applied Physics Letters, 100, 021911 (2012)

SUMMARY OF THE INVENTION

Problems to be Solved by the Invention

However, it has been found that, while the above-described oriented growth effect can be obtained in case of formation of the orientation control layer made of $Sb_2Te_3$ on a limited base substrate such as Si(111), Si(100) or others, or case of formation of the same on a surface of an electrode made of W or TiN, the above-described oriented growth effect cannot be obtained even in case of formation of the same on a surface of an oxide or a nitride such as $SiO_2$ or SiN. Therefore, there is a problem of limitation to an electronic device whose device structure has a specific base substrate or electrode substrate as the electronic device using the superlattice structure.

The present invention solves the above-described various conventional problems, and has an issue which achieves the following object. That is, the object of the present invention is to provide a crystal orientation layer laminated structure capable of widely selecting materials for the base substrate and electrode substrate, provide an electronic memory using the crystal orientation layer laminated structure, and provide a method for manufacturing the crystal orientation layer laminated structure.

Means for Solving the Problems

The means for solving the problems are explained as follows. <1> A crystal orientation layer laminated structure having such a feature as including a substrate, including an orientation control layer which is laminated on the substrate, which is made of any of germanium, silicon, tungsten, germanium-silicon, germanium-tungsten and silicon-tungsten, and whose thickness is at least 1 nm or more, and including a first crystal orientation layer which is laminated on the orientation control layer, which is made of any of SbTe, Sb$_2$Te$_3$, BiTe, Bi$_2$Te$_3$, BiSe and Bi$_2$Se$_3$ as a main component, and which is oriented in a certain crystal orientation.

<2> The crystal orientation layer laminating structure described in the above-described <1>, which includes a second crystal orientation layer which is laminated on the first crystal orientation layer, which is made of an alloy represented by the following general chemical formula (1), and which is oriented in a certain crystal orientation.

[Chemical Formula 1]

$$M_{1-x}Te_x \quad (1)$$

In the above-described chemical formula (1), a term "M" represents any atom of Ge, Al and Si, and a term "x" represents a numeric value of 0.5 or more and less than 1.

<3> The crystal orientation layer laminated structure described in the above-described <2> in which the first crystal orientation layer has a crystal structure having a hexagonal crystal system while the second crystal orientation layer has a crystal structure having a cubic crystal system, in which the c-axis of the first crystal orientation layer is oriented in the laminated layer direction, and in which the (111) plane of the second crystal orientation layer is oriented on a surface adjacent to the second crystal orientation layer.

<4> The crystal orientation layer laminated structure described in any of the above-described <1> to <3> in which the first crystal orientation layer is made of Sb$_2$Te$_3$ as a main component.

<5> The crystal orientation layer laminated structure described in any of the above-described <2> to <4> in which the second crystal orientation layer is made of GeTe as a main component.

<6> An electronic memory having such a feature as including at least the crystal orientation layer laminated structure described in any of the above-described <1> to <5>.

<7> A method for manufacturing a crystal orientation layer laminated structure having such a feature as including an orientation control layer formation step of film-forming any of germanium, silicon, tungsten, germanium-silicon, germanium-tungsten and silicon-tungsten on a substrate under an inert gas atmosphere so as to form an orientation control layer with a thickness of 1 nm or more, and a first crystal orientation layer formation step of film-forming a film-forming material containing any of SbTe, Sb$_2$Te$_3$, BiTe, Bi$_2$Te$_3$, BiSe and Bi$_2$Se$_3$, on the orientation control layer while maintaining the inert gas atmosphere in the orientation control layer formation step, so as to form a first crystal orientation layer which is oriented in a certain crystal orientation.

<8> The method for manufacturing a crystal orientation layer laminated structure described in the above-described <7> in which the first crystal orientation layer formation step is a step of film-forming Sb$_2$Te$_3$ in a state in which the orientation control layer is heated at 150° C. or higher and less than 300° C. so as to form the first crystal orientation layer.

Effects of the Invention

According to the present invention, the above-described various problems in the conventional technique can be solved, and it is possible to provide a crystal orientation layer laminated structure capable of widely selecting materials for the base substrate and the electrode substrate, an electronic memory using the crystal orientation layer laminated structure, and a method for manufacturing the crystal orientation layer laminated structure.

BRIEF DESCRIPTIONS OF THE DRAWINGS

Figure 1A:
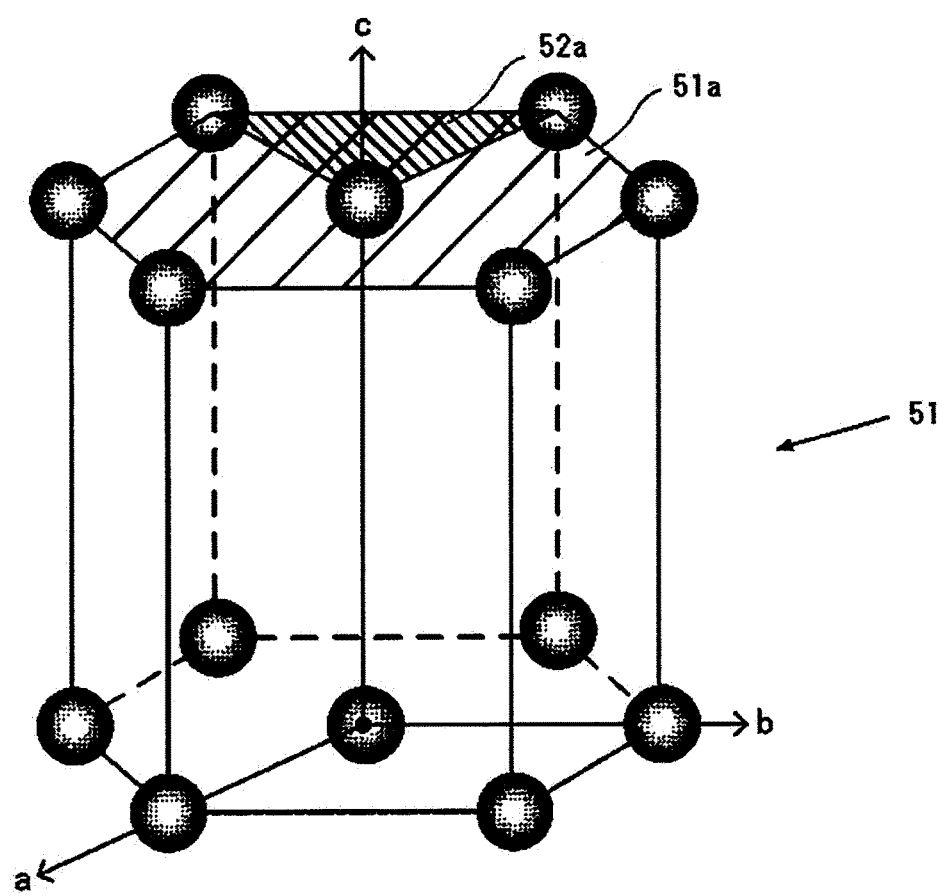
FIG. 1(a) is an explanatory diagram showing a crystal structure of a first crystal orientation layer having a hexagonal crystal system.

BEST MODE FOR CARRYING OUT THE INVENTION (Crystal Orientation Layer Laminated Structure)

A crystal orientation layer laminated structure according to the present invention includes at least a substrate, an orientation control layer and a first crystal orientation layer, and further includes a second crystal orientation layer or others if necessary.

<Substrate>

The above-described substrate is not particularly limited, and can be appropriately selected for any purpose, and the substrate can be cited as a base substrate such as Si substrate, SiO$_2$ substrate, SiN substrate, various glass substrates, Al$_2$O$_3$ substrate, MgO substrate, GaAs substrate, InP substrate and others, which are widely publicly known, and cited as an electrode substrate having an electrode made of W—Ti, Ti, Al, Pt, W, TiN or others formed on the above-described base substrate.

That is, the above-described substrate can be any substrate as long as the above-described orientation control layer described below in detail can be laminated thereon, and a technical core of the present invention is to control the orientation property of the first crystal orientation layer and the orientation property of the second crystal orientation layer laminated on the first crystal orientation layer by laminating the first crystal orientation layer on such an appropriate substrate having the above-described orientation control layer as a base layer.

<Orientation Control Layer>

The above-described orientation control layer is laminated on the substrate, is made of any of germanium, silicon, tungsten, germanium-silicon, germanium-tungsten and silicon-tungsten, and is formed as a layer whose thickness is at least 1 nm or more.

The above-described orientation control layer is not particularly limited as long as it has such characteristics, may be made in either a crystalline state or an amorphous state, and can be formed on any of the above-described desired substrates. However, when the thickness is less than 1 nm, it becomes difficult to control the orientation property of the first crystal orientation layer. Moreover, when the thickness exceeds 100 nm, the surface roughness become large, and therefore, it becomes difficult to control the orientation property sometimes.

As described above, by laminating the first crystal orientation layer on such an orientation control layer as the crystal orientation layer laminated structure, the orientation property of the first crystal orientation layer can be controlled, and moreover, the orientation property of the second orientation layer formed on the first crystal orientation layer can be controlled.

A reason why the orientation property can be controlled as described above has not been necessarily clarified. However, it is considered that this is because of the influence of the thermodynamic interaction between the respective elements forming the orientation control layer and the first crystal orientation layer.

A method for forming the orientation control layer is not particularly limited, can be appropriately selected for any purpose, and can be cited as, for example, a sputtering method, a vapor deposition method, a molecular beam epitaxy method, an ALD (Atomic Layer Deposition) method, a CVD (Chemical Vapor Deposition) method and others.

<First Crystal Orientation Layer>

The first crystal orientation layer is laminated on the orientation control layer, is made of any of SbTe, $Sb_2Te_3$, BiTe, $Bi_2Te_3$, BiSe and $Bi_2Se_3$ as a main component, and is formed as a layer oriented in a certain crystal orientation.

In the present specification, note that the "main component" indicates an element for forming a basic unit lattice of the layer.

The above-described first crystal orientation layer is not particularly limited. However, the first crystal orientation layer preferably has a crystal structure having a hexagonal crystal system, and its c-axis is preferably oriented towards normal (perpendicular) to the surface of a laminated layer.

When the layer has such a crystal structure, a next-laminated layer becomes a template for generating an orientation using this layer as the base layer, and therefore, a superlattice structure formed of these layers can be easily obtained.

The method for forming the first crystal orientation layer is not particularly limited. However, for example, a sputtering method, a vacuum vapor deposition method, a molecular beam epitaxy method, an ALD method, a CVD method or others is preferable because the crystal structure with the c-axis orientation can be easily obtained.

<Second Crystal Orientation Layer>

The above-described second crystal orientation layer is laminated on the first crystal orientation layer, is made of an alloy represented by the following general chemical formula (1) as a main component, and is formed as a layer that is oriented in a certain crystal orientation. By making the second crystal orientation layer laminate on the first crystal orientation layer whose orientation property is controlled by the orientation control layer, the second crystal orientation layer is formed as a layer having the common crystal axis with that of the first crystal orientation layer.

[Chemical Formula 2]

$$M_{1-x}Te_x \quad (1)$$

In the above-described formula (1), a term "M" represents any of Ge, Al and Si, and a term "x" represents a numeric value of 0.5 or more and less than 1.

As the alloy represented by the above-described formula (1), GeTe is particularly preferable because of a large dielectric constant.

Although not particularly limited, the second crystal orientation layer preferably has a crystal structure having a hexagonal crystal system, and has a (111) plane laminated on a surface adjacent to the first crystal orientation layer. Particularly, the second crystal orientation layer further preferably has a crystal structure having a face-centered cubic system, and has a (111) plane laminated on a surface adjacent to the first crystal orientation layer.

By using such a crystal structure, a next-laminated layer becomes a template for generating an orientation taking this layer as a base, and therefore, a superlattice structure formed by these layers can be easily obtained.

Although not particularly limited, as a method for forming the second crystal orientation layer, for example, a sputtering method, a vacuum vapor deposition method, a molecular beam epitaxy method, an ALD method, a CVD method or others is preferable because the crystal structure with the c-axis orientation can be easily obtained.

Here, each laminated state of the first crystal orientation layer and the second crystal orientation layer will be described with reference to FIGS. 1(a) and 1(b). Note that FIG. 1(a) is an explanatory diagram showing the crystal structure of the first crystal orientation layer having the hexagonal crystal system, and FIG. 1(b) is an explanatory diagram showing the crystal structure of the second crystal orientation layer having the cubic crystal system.

Figure 1B:
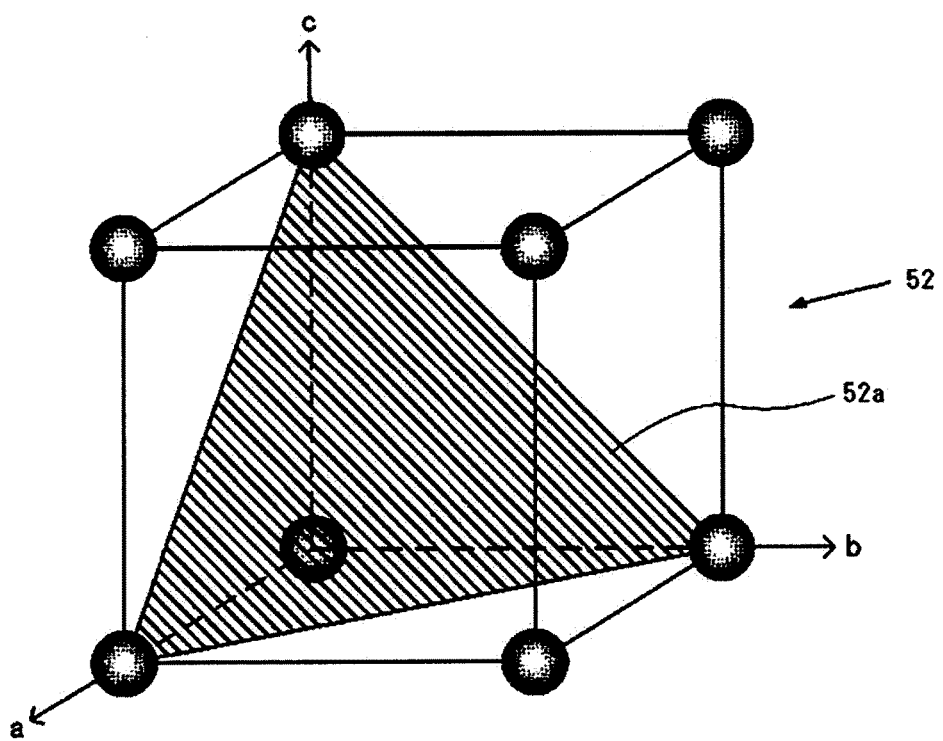
FIG. 1(b) is an explanatory diagram showing a crystal structure of a second crystal orientation layer having a cubic crystal system.

As shown in FIG. 1(a), when a crystal orientation layer 51 having the hexagonal crystal system is c-axis oriented as the first crystal orientation layer, an adjacent surface 51a is hexagon. For this reason, when a crystal orientation layer 52 having the cubic crystal system is film-formed on the surface of the crystal orientation layer 51 as the second crystal orientation layer, the (111) plane shown in FIG. 1(b) becomes an adjacent surface 52a. That is, the (111) plane having the cubic crystal system is matched with the adjacent surface 52a of the c-axis oriented crystal orientation layer 51 because the (111) plane has a triangular shape. For this reason, when the crystal orientation layer 52 having the cubic crystal system is film-formed on the surface of the c-axis oriented crystal orientation layer 51, each of these adjacent surfaces 52a can be formed into a (111) plane of the crystal orientation layer 52. On the other hand, when the crystal orientation layer 52 is formed without the crystal orientation layer 51, the crystal orientation layer 52 is oriented into, for example, a (100) plane. As a result, lattice disorder tends to occur in a superlattice structure formed by these laminated structures.

In the above-described crystal orientation layer laminated structure, an appropriate member may be arranged in addition to the second crystal orientation layer for any purpose. The following is the explanation about a configuration to be used as an electronic memory.

(Electronic Memory)

The electronic memory of the present invention includes at least the above-described crystal orientation layer laminated structure, and includes an appropriate member if needed.

The electronic memory is not particularly limited as long as the electronic memory includes such characteristics, and will be described in detail while citing three embodiments as configuration examples.

First Embodiment

An electronic memory according to a first embodiment includes: the substrate; the orientation control layer; a spin current generation layer and a spin current accumulation layer configured by the first crystal orientation layer and the second crystal orientation layer; and a pair of electrodes, and further includes an appropriate member such as a magnetic field generation unit and a spin electron supply layer for any purpose.

—Substrate and Orientation Control Layer—

The above-described substrate and orientation control layer can have the same configuration as that explained in the above-described crystal orientation layer laminated structure.

—Spin Current Generation Layer—

The above-described spin current generation layer includes the first crystal orientation layer and the second crystal orientation layer to be laminated on the first crystal orientation layer, and the thickness of the first crystal orientation layer is set to a range from 0 nm or more to less than 2 nm.

In the spin current generation layer configured as described above, the Rashba effect can be generated so that a density difference is made between two spin electrons having different spin states from each other in the first crystal orientation layer, when an external electric field (voltage) is applied between the electrodes. That is, the first crystal orientation layer holds both the time reversal symmetry and spatial inversion symmetry. On the other hand, the second layer has the time-reversal symmetry, but breaks the spatial inversion. The combination of the laminated layer consisted of the first crystal layers and the second crystal layers makes a inter-mixed band structure, which enhances the Rashba effect as large as possible, when an external electric field is applied because of the breaking the total spatial inversion symmetry. In such the system, the band degeneracy is lifted except for the time inversion symmetry center point, and an energy difference is made between two spin bands right above the Fermi level, so that the spin current generation layer generates the Rashba effect. As a result, a spin density difference is made between the two spin electrons having different spin states from each other in the first crystal orientation layer, so that a spin current can be generated. Note that the above-described spin indicates a spin-polarized electron.

In the following description, for convenience of explanation, the first crystal orientation layer and the second crystal orientation layer, which form the spin current generation layer, are respectively referred to as crystal orientation layer A and crystal orientation layer B.

In the above-described spin current generation layer, the thickness of the crystal orientation layer B is preferably more than 0 nm and 4 nm or less although not particularly limited. When the thickness exceeds 4 nm, independent unique characteristics are developed sometimes.

Moreover, although not particularly limited, the above-described spin current generation layer preferably has a configuration in which the crystal orientation layer A and the crystal orientation later B are alternately laminated repeatedly in plurality of times. In such a configuration, the large Rashba effect can be easily obtained in accordance with the number of repetitions.

—Spin Current Accumulation Layer—

The above-described spin current accumulation layer includes the first crystal orientation layer and the second crystal orientation layer laminated on the first crystal orientation layer, and the thickness of the first crystal orientation layer is set to 2 nm or more and 10 nm or less.

In the spin current accumulation layer configured as described above, the characteristics as a topological insulator can be developed, and the second crystal orientation layer has a band gap. That is, the first crystal orientation layer holds both the time reversal symmetry and spatial inversion symmetry. On the other hand, the second layer has the time-reversal symmetry, but breaks the spatial inversion when an external electric field is applied. However, in this case with a first layer thickness of 2 nm or more, the generated inter-mixed band is partially limited into the narrow range at around the interfaces, and in the first crystalline layers a band gap is generated because of the characteristics of topological insulator. That is, the spin electrons cannot enter or penetrate the body of the first crystal layers. As a result, spin electrons are locked and accumulated into the interfaces with the second crystal layers.

In the following description, for convenience of explanation, the first crystal orientation layer and the second crystal orientation layer, which form the spin current accumulation layer, are respectively referred to as crystal orientation layer C and crystal orientation layer D.

In the above-described spin current accumulation layer, the thickness of the crystal orientation layer D is preferably more than 0 nm and 4 nm or less as similar to that of the crystal orientation layer B although not particularly limited.

Moreover, although not particularly limited, the above-described spin current accumulation layer preferably has a configuration in which the crystal orientation layer C and the crystal orientation later D are alternately laminated repeatedly in plurality of times. In such a configuration, the large spin current can be accumulated in accordance with the number of repetitions.

From a viewpoint of achieving a memory operation by using a simple configuration, in the electronic memory according to the first embodiment, note that the spin current generation layer and the spin current accumulation layer are preferably configured so that the crystal orientation layer C which is the spin current accumulation layer is directly laminated on the crystal orientation layer B which is the spin current generation layer.

—Electrode—

The above-described pair of electrodes are arranged so as to sandwich the orientation control layer, the spin current generation layer and the spin current accumulation layer therebetween.

The above-described electrode is not particularly limited, can be appropriately selected for any purpose, and can be formed so that an electrode for use in a publicly-known semiconductor element is arranged by using a publicly-known method.

Moreover, as the above-described electrode, at least one electrode (for example, lower electrode) can be arranged as the electrode substrate explained in the crystal orientation layer laminated structure, and can be formed also on the base substrate.

—Magnetic Field Generation Unit—

While the above-described spin current generation layer can generate an inner magnetic field by application of a voltage to itself so as to make the density difference between the spin electrons, and an auxiliary magnetic field is externally applied thereto, so that the Rashba effect can be amplified.

As the above-described magnetic field generation unit, for example, a magnet serving as an auxiliary unit of the electronic memory according to the first embodiment may be arranged outside, or a magnetic layer having magnetization may be laminated in the laminated structure of the electronic memory according to the first embodiment.

As the above-described magnet and magnetic layer are not particularly limited, can be appropriately selected for any purpose, and can be configured so that a publicly-known magnet or magnetic layer is arranged by using a publicly-known method. However, in order not to interrupt the memory operations in the spin current generation layer and the spin current accumulation layer, the magnetic layer is preferably not arranged between these layers but between these layers and the electrode.

—Spin Electron Supply Layer—

As described above, while the spin current generation layer can generate an inner magnetic field by application of a voltage to itself so that a density difference can be made between the spin electrons, and the spin electrons are externally supplied thereto, so that the Rashba effect can be amplified. For such a purpose as described above, the spin electron supply layer for supplying the spin electrons to the spin current generation layer can be arranged in the electronic memory according to the first embodiment.

The spin-electron supply layer is not particularly limited, and a layer made of, for example, cobalt, platinum, an alloy of these elements, or others is exemplified as the spin electron supply layer, and a sputtering method or others is exemplified as a method of forming the layer.

In the arrangement of the above-described spin electron supply layer, the electronic memory according to the first embodiment is preferably configured so that the spin electron supply layer is arranged so as to be adjacent to a surface of the spin current generation layer on an opposite side of the surface on which the spin current accumulation layer is arranged, or a surface of the spin current accumulation layer on an opposite side of the surface on which the spin current generation layer is arranged.

The main configuration and memory operations of the electronic memory according to the first embodiment will be explained in more detail with reference to FIG. 2. Note that FIG. 2 is a cross-sectional view showing the layer configuration of the electronic memory according to the first embodiment.

Figure 2:
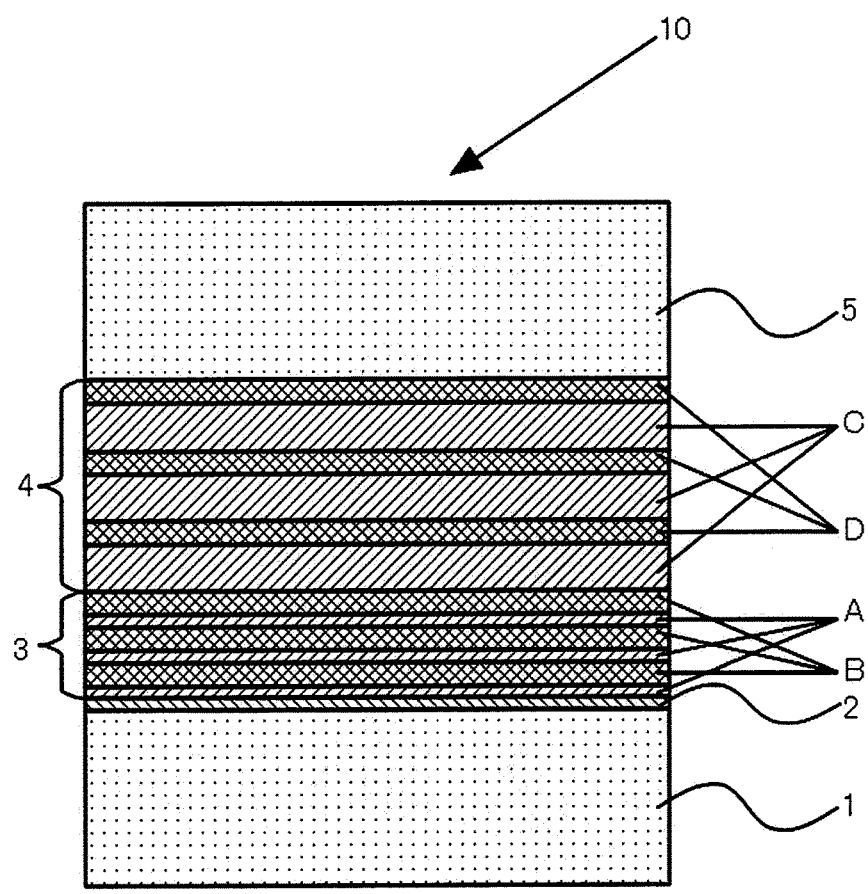
FIG. 2 is a cross-sectional view showing a layer structure of an electronic memory according to a first embodiment.

As shown in FIG. 2, the electronic memory 10 is configured so that the orientation control layer 2, the spin current generation layer 3, the spin current accumulation layer 4 and an upper electrode 5 are arranged on the lower electrode 1 (electrode substrate) in this order.

The spin current generation layer 3 is formed by alternately laminating a crystal orientation layer A containing, for example, $Sb_2Te_3$ as a main component and having a thickness thicker than 0 nm and less than 2 nm, and a crystal orientation layer B containing, for example, GeTe as a main component, repeatedly three times.

The spin current accumulation layer 4 is formed by alternately laminating a crystal orientation layer C containing, for example, $Sb_2Te_3$ as a main component and having a thickness of 2 nm or more and 10 nm or less, and a crystal orientation layer D containing, for example, GeTe, repeatedly three times.

In the electronic memory 10 formed as described above, a density difference is made between the two spin electrons having different spin states from each other in the crystal orientation layer A, based on a voltage application from the lower electrode 1 or the upper electrode 5. These spin electrons flow from the spin current generation layer 3 into the spin current accumulation layer 4, and the spin electron having a higher density is accumulated on at least a part of the spin current accumulation layer 4 (for example, a surface of the spin current accumulation layer 4, the surface being on the spin current generation layer 3 side).

The spin current formed of the accumulated spin electron having the higher density can be preserved as long as it is not externally released, and can also be erased by a voltage application from the reversed direction.

As a result, the electronic memory 10 can perform the memory operations based on the spin states of the spin electrons. In accordance with these memory operations, the energy of an electric current utilized for the voltage application can be utilized for the formation of spin currents as it is, without the necessity of being converted to Joule heat, and therefore, large power saving can be achieved.

Second Embodiment

Next, an electronic memory according to a second embodiment will be explained.

The electronic memory according to the second embodiment includes the above-described substrate, the orientation control layer, a recording layer formed by the first crystal orientation layer and the second crystal orientation layer, a spin injection layer and a pair of electrodes, and further includes an appropriate member such as a magnetization unit if needed.

In the electronic memory according to the first embodiment, the memory operations are performed by utilizing two states of a spin released state and a spin accumulated state. On the other hand, in the electronic memory according to the second embodiment, a memory operation which targeting information to be multi-valued in accordance with the number of laminated layers of the recording layer can be further performed.

—Substrate, Orientation Control Layer, Electrode—

The above-described substrate, the above-described orientation control layer and the above-described electrode can have the same configurations as those explained in the electronic memory according to the first embodiment. The electronic memory according to the second embodiment mainly is different from the electronic memory according to the first embodiment in mainly that it has the above-described recording layer and spin injection layer explained below in detail.

—Recording Layer—

The above-described recording layer is formed by laminating the first crystal orientation layer and the second crystal orientation layer in the crystal orientation layer laminated structure, and the thickness of the first crystal orientation layer is set to a range from 2 nm or more to 10 nm or less. Moreover, the thickness of the second crystal orientation layer is set to more than 0 nm and 4 nm or less.

The recording layer may be a single layer. However, by forming the recording layer by laminating at least two or more layers, binary or more multi-valued information can be recorded.

The recording layer has the same configuration as that of the spin current accumulation layer of the electronic memory according to the first embodiment. However, the electronic memory according to the second embodiment is directed to accumulate the spin for each of the recording layers, based on knowledge relating to the characteristics of the above-described recording layer described below.

That is, the first crystal orientation layer in the recording layer functions as the topological insulator so that the spin injected from the spin injection layer can exist on its surface or interface. Moreover, a phase of the second crystal orientation layer in the recording layer further can be further changed between a first crystal phase having a space inversion symmetry structure at the center of the layer and a second crystal phase in which the space inversion symmetry collapses, based on the arrangement of "M" in the alloy represented by the above-described general chemical formula (1). The second crystal phase has a magnetic property of a ferromagnetic body so that the spin electrons can be accumulated therein. Moreover, in the second crystal orientation layer, while the phase is changed from the first crystal phase to the second crystal phase by applying a comparatively low voltage thereto, the phase is changed to the first crystal phase without the magnetic property by applying a comparatively high voltage thereto.

In the electronic memory according to the second embodiment, by utilizing these characteristics, memory operations can be performed so as to have the second crystal phase capable of accumulating the spin as a set state and the first crystal phase in which the spin is released as a reset state.

—Spin Injection Layer—

The above-described spin injection layer is made of a magnetic material, and is configured as a layer for injecting the spin to the recording layer in a state in which the magnetic material is magnetized. When a voltage is applied in its magnetized state, note that the spin injection layer plays a role of polarizing the spin characteristics of electrons that are conducted to the recording layer by using the above-described magnetic material.

The magnetic material is not particularly limited, and materials used for a magnetic layer forming material for a publicly-known magnetic memory can be cited as the magnetic material, specifically, TbFeCo, FeCo, MnCr, MnPt, and others are cited. They are ferromagnetic bodies, and are utilized for the purposes of forming a magnetic field so that the orientations of the spins are perpendicular to the surface of the spin injection layer serving as a magnetic layer and of transferring the orientations of the spins to the recording layer arranged in parallel with the spin injection layer while the orientations are unified.

Although not particularly limited, the thickness of the spin injection layer is preferably set to 1 nm to 10 nm.

When the thickness is less than 1 nm, a sufficient spin orientation is not obtained in some cases. When it exceeds 10 nm, it is difficult to erase data in some cases since the magnetization is too strong.

Moreover, the method for forming the spin injection layer is not particularly limited, and a sputtering method, a molecular beam epitaxy method, an ALD method, a CVD method and others are cited as the method.

Furthermore, as a position at which the spin injection layer is arranged, the spin injection layer is arranged on a side on which the electrode for allowing the electrons to flow into the recording layer is arranged in order to inject the spin into the recording layer.

—Magnetization Unit—

From the viewpoint of the injection of the spin into the recording layer, a role is provided to the electronic memory according to the second embodiment, the role magnetizing the spin injection layer so as to align the orientations of the spins by applying a magnetic field perpendicular to the surface of the spin injection layer to the spin injection layer after the formation of the spin injection layer. The magnetization unit may be arranged on the electronic memory, or may be removed after the formation of the spin injection layer followed by fixation of the magnetized state.

In the former case, from the viewpoint of reinforcing the intensity of the magnetic field formed by the spin injection layer, the injection of the spin from the magnetized spin injection layer to the recording layer may be assisted by arranging the magnetization unit as a layer to be laminated in parallel with the spin injection layer. In this case, the above-described magnetization unit is configured as a magnetic layer that forms a magnetic field in a direction perpendicular to the surface of the spin injection layer, and that injects the spin to the recording layer through the spin injection layer.

Moreover, in the latter case, the spin is injected into the recording layer by a magnetic field formed by the spin injection layer whose magnetized state has been fixed.

Note that the magnetization unit is not particularly limited, and can be configured by a publicly-known permanent magnet, electromagnet or others.

Figure 3:
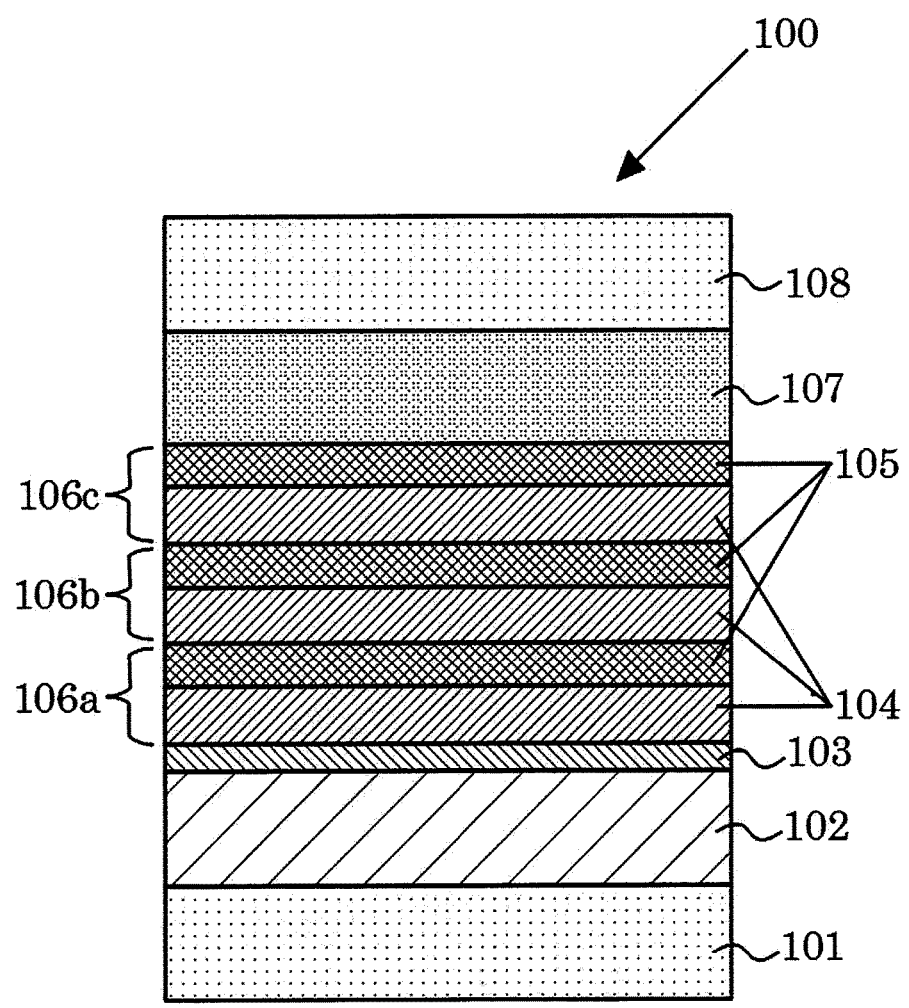
FIG. 3 is a cross-sectional view showing a layer structure of an electronic memory according to a second embodiment.

With reference to FIG. 3, a main configuration of the electronic memory according to the second embodiment will be described in more detail. Note that FIG. 3 is a cross-sectional view showing a layer configuration of the electronic memory according to the second embodiment.

As shown in FIG. 3, an electronic memory 100 has a configuration in which a semiconductor substrate 102, an orientation layer 103, three recording layers 106a to 106c, a spin injection layer 107, and a laminated upper electrode 108 are arranged on a laminated lower electrode 101 in this order.

Moreover, each of the three recording layers 106a to 106c has a structure in which a second crystal orientation layer 105 containing, for example, GeTe as a main component is laminated on a first crystal orientation layer 104 containing, for example, $Sb_2Te_3$ as a main component and having a thickness of 2 nm or more and 10 nm or less.

Note that the configuration of the electronic memory 100 is merely one example, and the lower electrode 101 may be arranged on the semiconductor substrate 102, or the orientation control layer 103 may be directly arranged on the lower electrode 101 (electrode substrate) without using the semiconductor substrate 102. Moreover, it is only required to arrange the spin injection layer 107 to be closer to a side where the upper electrode 108 for allowing electrons to flow into the recording layers 106a to 106c is arranged than the recording layers 106a to 106c, and the spin injection layer 107 may be replaced with the upper electrode 108 in a laminating order.

Next, the function of the electronic memory according to the second embodiment will be described while exemplifying the electronic memory 100.

The first crystal orientation layer 104 of the recording layers 106a to 106c functions as the above-described topological insulator so as to transfer the spin to the second crystal orientation layer 105. The second crystal orientation layer 105 has the first crystal phase formed of a structure having the space inversion symmetry at the center of the layer and the second crystal phase in which the space inversion symmetry collapses, based on the arrangement of "M" (germanium atom, aluminum atom or silicon atom) in the above-described general chemical formula (1). The second crystal phase develops the Rashba effect and magnetic characteristics, and functions as a ferromagnetic body capable of preserving the spin. Moreover, in order to preferentially develop the second crystal phase, a comparatively low voltage may be applied thereto. A specific value of this voltage can be checked by previously measuring the characteristics.

Here, when the second crystal phase in a mixed phase state is brought to the state (set state) in which the second crystal phase is preferentially developed by applying a comparatively low voltage thereto, and then, when a voltage is applied from the external power supply to the electronic memory 100, the electrons spin-polarized by the spin injection layer 107 are allowed to flow into the recording layers 106a to 106c in accordance with the voltage value, so that the spin can be accumulated in the recording layers 106a to 106c. Each of the spins is preserved by the first crystal orientation layer 104 functioning as the topological insulator and the second crystal orientation layer 105 in the set state.

At this time, the accumulations of the spin electrons to the recording layers 106a to 106c are successively started from the recording layer 106a closest to the lower electrode 101 side into which the electrons are allowed to flow, and then, the accumulation is performed in the recording layer 106b next closest thereto when the accumulation of the spin is saturated in the recording layer 106a, and lastly, the accumulation is performed in the recording layer 106c.

Figure 4A:
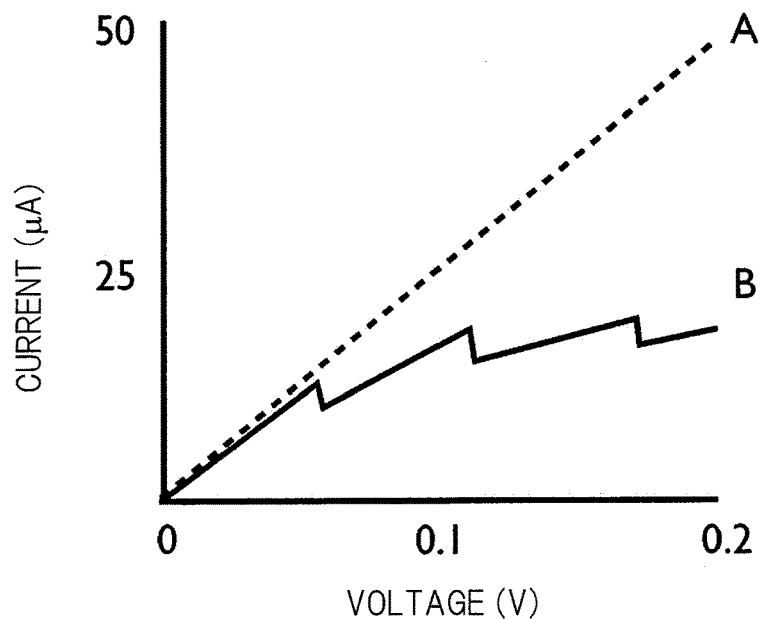
FIG. 4(a) is an explanatory diagram explaining current-voltage characteristics of the electronic memory according to the second embodiment.
Figure 4B:
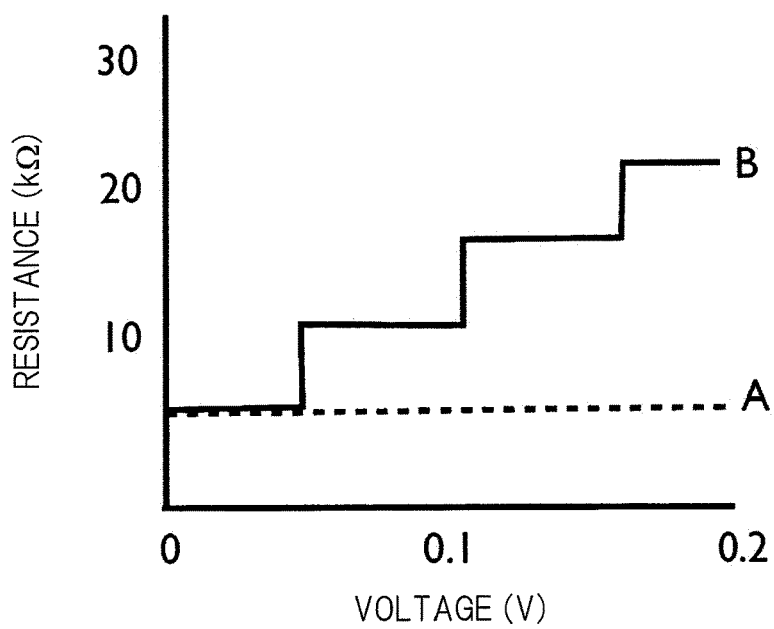
FIG. 4(b) is an explanatory diagram explaining resistance-voltage characteristics of the electronic memory according to the second embodiment.

This behavior will be explained by using FIGS. 4(a) and 4(b). Note that FIG. 4(a) is an explanatory diagram that explains the current-voltage characteristics of the electronic memory according to the second embodiment, and FIG. 4(b) is an explanatory diagram that explains the resistance-voltage characteristics of the electronic memory according to the second embodiment. In the respective drawings, note that a reference character "A" represents the characteristics in a case of no application of the magnetic field, and a reference character "B" represents the characteristics in a case of application of the magnetic field.

As shown in FIG. 4(a), while the current value increases in proportion to increase in the voltage value in the characteristics of the reference character A, the current value decreases step by step as the increase in the voltage value in the characteristics of the reference character B. That is, when a magnetic field is applied in a layer-laminating direction of the recording layers 106a to 106c while magnetizing the spin injection layer 107 by using an electromagnet or others, the current value decreases step by step in accordance with the spin accumulation step by step into the recording layers 106a to 106c. Moreover, as shown in FIG. 4(b), while the resistance value increases in proportion to increase in the voltage value in the characteristics of the reference character A, the resistance value increases step by step as the increase in the voltage value in the characteristics of the reference character B. That is, when a magnetic field is applied by using an electromagnet or others, the resistance value increases step by step in accordance with the spin accumulation step by step into the recording layers 106a to 106c.

In the electronic memory 100, the state of the spin accumulation into the recording layers 106a to 106c can be controlled by utilizing state-value changing phenomenon such as the step-by-step decrease phenomenon of the current value and the increase of the resistance value and others so as to set the applied voltage to a predetermined value, so that the multi-valued information can be recorded and reproduced.

Note that the present example forms a configuration capable of recording and reproducing 4-valued information by forming the recording layer to be three layers. However, by increasing the number of recording layers, a memory that deals with more multi-valued information can be prepared.

Moreover, by applying a comparatively high voltage to the electronic memory 100, the second crystal phase of the second crystal orientation layer 105 is phase-changed to the first crystal phase to lose the magnetization, and therefore, the recorded information of the recording layers 106a to 106c based on the spin accumulation state can be erased (as a reset state). By again applying a comparatively low voltage, this reset state can be returned to the above-described set state, so that information can be repeatedly recorded and erased in the electronic memory 100 as many times as desired. Note that a specific value of the voltage developing the reset state can be checked by previously measuring the characteristics. Moreover, while the reproduction of the recording state onto the recording layer has been explained by using the resistance value, the information may be reproduced by specifying the recording state based on a value of a light reflectance of the recording layer.

Third Embodiment

Next, an electronic memory according to a third embodiment will be explained.

The electronic memory according to the third embodiment includes the above-described substrate, the orientation control layer, a superlattice structure layer formed by the first crystal orientation layer and the second crystal orientation layer, and a pair of electrodes, and further includes an appropriate member if needed.

The electronic memory according to the third embodiment is different from each electronic memory according to the first and second embodiments, and records information therein by utilizing a resistance change caused by a phase change of the superlattice structure.

—Substrate, Orientation Control Layer, Electrode—

The above-described substrate, the above-described orientation control layer and the above-described electrode can have the same configurations as those explained in each electronic memory according to the first and second embodiments.

—Superlattice Structure—

The above-described superlattice structure is configured by a superlattice structural body formed by alternately laminating the first crystal orientation layer and the second crystal orientation layer in the crystal orientation layer laminated structure.

While the thickness of the first crystal orientation layer is not particularly limited as long as the above-described resistance change is generated, the thickness is set to, for example, a range from 1 nm or more to 10 nm or less. While the thickness of the second crystal orientation layer is not particularly limited as long as the above-described resistance change is generated, the thickness is set to, for example, a range from more than 0 nm to 4 nm or less.

Moreover, while the thickness of the entire superlattice structural body is not particularly limited as long as the above-described resistance change is generated, the thickness is set to, for example, a range from 2 nm or more to 50 nm or less.

Here, in a general phase-change solid-state memory, the recording layer is configured by an alloy layer formed by mixing metal materials such as $Sb_2Te_3$ or GeTe at a certain ratio, and a switching mechanism relating to memory operations is made by controlling the melt of the alloy layer caused by the injection of current pulses, the amorphous state caused thereafter, and the crystallization of the amorphous alloy layer. For example, when the resistance in the crystal state of the alloy layer is about 1 k$\Omega$ and the resistance in the amorphous state of the alloy layer is about 1 M$\Omega$, the bit signals of 0 and 1 are distinguished from each other by utilizing the resistance difference between these states.

On the other hand, in the electronic memory according to the third embodiment having the superlattice structure, the switching is performed by utilizing generation of a resistance change by phase-changing the superlattice structure into a phase having a low resistance value (for example, about 10 kΩ) referred to as a set phase and a phase having a high resistance value (for example, about 1 MΩ) referred to as a reset phase based on different atomic arrangements of "M" (see the above-described chemical formula (1)) on the crystal in the second crystal orientation layer. Hereinafter, the electronic memory according to the third embodiment having the superlattice structure not causing the melt change is referred to as "TRAM" as a non-volatile solid-state memory using the superlattice structure.

In the above-described TRAM, the switching can be performed while significantly reducing an energy of a term referred to as entropy which is one type of thermal energy relating to the atomic arrangement since the operation for the melt is not included in the switching in the above-described general phase-change-type solid-state memory, and therefore, the energy required for the switching can be reduced down to $1/10$ to $1/100$ of that of the above-described general phase-change solid-state memory.

An effect of the energy reduction in the TRAM is influenced by the crystal orientation property in the superlattice structure, and it is helpful to control the orientation properties of the first crystal orientation layer and the second crystal orientation layer configuring the superlattice structure by using the orientation control layer in the crystal orientation layer laminated structure. Moreover, by arranging the orientation control layer, the superlattice structure whose orientation property is controlled can be formed on an appropriate substrate.

The main configuration and memory operations of the electronic memory according to the third embodiment will be explained in more detail with reference to FIG. 5. Note that FIG. 5 is a cross-sectional view showing the layer configuration of the electronic memory according to the third embodiment.

Figure 5:
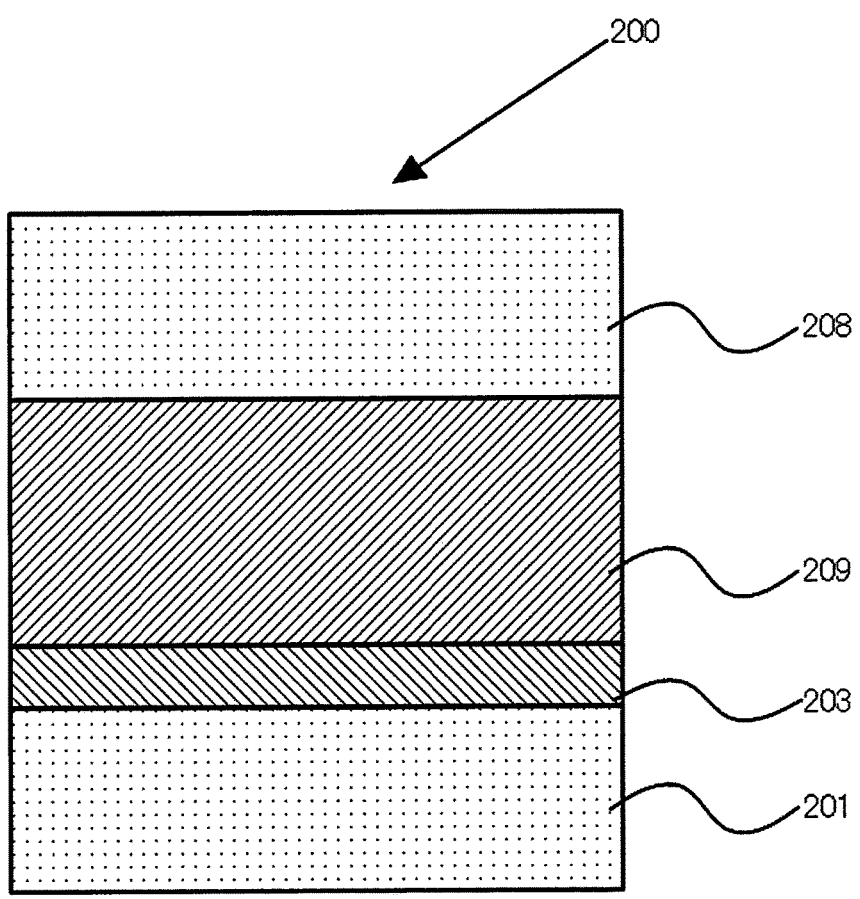
FIG. 5 is a cross-sectional view showing a layer structure of an electronic memory according to a third embodiment.

As shown in FIG. 5, an electronic memory 200 is configured so that, for example, an orientation control layer 203, a superlattice structure 209 and an upper electrode 208 are arranged on a lower electrode 201 (electrode substrate) in this order.

The superlattice structure 209 is as a superlattice structure formed by alternately laminating the first crystal orientation layer containing, for example, $Sb_2Te_3$ as a main component and having a thickness of 1 nm or more and 10 nm or less, and the second crystal orientation layer containing, for example, GeTe as a main component and having a thickness of more than 0 nm and 4 nm or less, and the thickness of the entire superlattice structure 209 is set to, for example, a range from 2 nm to 50 nm.

In the electronic memory 200 configured as described above, the bit signals of 0, 1 can be recorded and read by controlling the phase change between the set phase and the reset phase of the superlattice structure 209 by applying a voltage, and by measuring the resistance value.

(Method for Manufacturing Crystal Orientation Layer Laminated Structure)

A method for manufacturing the crystal orientation layer laminated structure includes at least an orientation control layer formation step and a first crystal orientation layer formation step.

The crystal orientation layer laminated structure and the electronic memory include structures except for the orientation control layer and the first crystal orientation layer. However, since the methods for forming these structures are in common with those items explained in the above-described crystal orientation layer laminated structure and the above-described electronic memory, explanations thereof will be omitted.

The above-described orientation control layer formation step is a step of forming the orientation control layer having a thickness of 1 nm or more by forming any of germanium, silicon, tungsten, germanium-silicon, germanium-tungsten and silicon-tungsten on the substrate under an inert gas atmosphere.

The above-described inert gas is not particularly limited and can be appropriately selected for any purpose, and an argon gas, a nitrogen gas and others can be cited as the inert gas.

Moreover, the method for forming the above-described orientation control layer is not particularly limited and can be appropriately selected for any purpose, and a sputtering method, a vapor deposition method, a molecular beam epitaxy method, an ALD method, a CVD method and others can be cited as the method.

Note that, when the orientation control layer is formed on the electrode substrate, that is, on the substrate made of Si, W or others, in performing the above-described orientation control layer forming step, an etching step for removing an oxide layer ($SiO_2$, $WO_2$ or others) on the surface of the substrate is preferably performed as a pretreatment step of the orientation control layer forming step.

The etching step is not particularly limited and can be performed by a publicly-known method, and, for example, a method of performing reverse sputtering by using an Ar gas or others can be cited for the step.

Moreover, although an etching depth into the substrate in the etching step is not particularly limited, a depth of 5 nm to 10 nm from the substrate surface is preferable. By the etching down to such a depth, the orientation property of the first crystal orientation layer and the second crystal orientation layer of the orientation control layer can be improved.

The first crystal orientation layer formation step is a step of forming the first crystal orientation layer that is oriented to a certain crystal orientation by film-forming a film-forming material containing any of SbTe, $Sb_2Te_3$, BiTe, $Bi_2Te_3$, BiSe and $Bi_2Se_3$, on the orientation control layer while the inert gas atmosphere in the orientation control layer formation step is maintained.

The method for forming the first crystal orientation layer is not particularly limited and can be appropriately selected for any purpose, and, for example, a sputtering method, a vapor deposition method, a molecular beam epitaxy method, an ALD method, a CVD method and others can be cited as the method.

A film-forming temperature of the first crystal orientation layer is not particularly limited. However, when the firm-forming material is $Sb_2Te_3$, the above-described first crystal orientation formation step is preferably a step of forming the first crystal orientation layer by film-forming $Sb_2Te_3$ in a state in which the orientation control layer is heated to a temperature at 150° C. or more and less than 300° C. When the above-described film-forming temperature is out of the above-described temperature range, the orientation property of the first crystal orientation layer is sometimes lost.

EXAMPLES

Example 1

After a surface of a glass substrate (made by HOYA GLASS DISK Co., Ltd., WFN5 65-20-0.635PT) is polished by cerium oxide and colloidal silica so as to have an average surface roughness (Ra) of 2 nm or less, deoiling of the surface has been performed by a sodium hydroxide aqueous solution, and the surface has been washed, and the resulting substrate has been set into a sputtering apparatus (made by Shibaura Mechatronics Corporation, CFS-4EP-LL).

Next, a pressure inside the sputtering apparatus has been reduced to $5 \times 10^{-4}$ Pa or less.

Next, the pressure inside the sputtering apparatus has been maintained at 0.5 Pa while an argon gas serving as an inert gas has been introduced into the sputtering apparatus at a flow rate of 10 sccm (1 sccm=$1.69 \times 10^3$ Pa·m³/sec).

An amorphous silicon film serving as an orientation control layer has been film-formed on the above-described glass substrate so as to have a thickness of 50 nm (as the orientation control layer formation step) by using a disc-shaped silicon material having a diameter of 3 inches (made by Mitsubishi Materials Corporation, sputtering target) arranged inside the sputtering apparatus as a target under a film-formation condition of RF power of 100 W at a temperature of 250° C.

Successively, an $Sb_2Te_3$ film serving as a first crystal orientation layer has been film-formed on the orientation control layer so as to have a thickness of 50 nm (as the first crystal orientation layer formation step) by using a disc-shaped $Sb_2Te_3$ material having a diameter of 3 inches (made by Mitsubishi Materials Corporation, sputtering target) as a target while the atmosphere inside the sputtering apparatus has been maintained under a film-forming condition of RF power of 20 W at a temperature of 250° C.

As described above, a crystal orientation layer laminated structure according to Example 1 formed by laminating the orientation control layer and the first crystal orientation layer on the substrate in this order has been manufactured.

Figure 6:
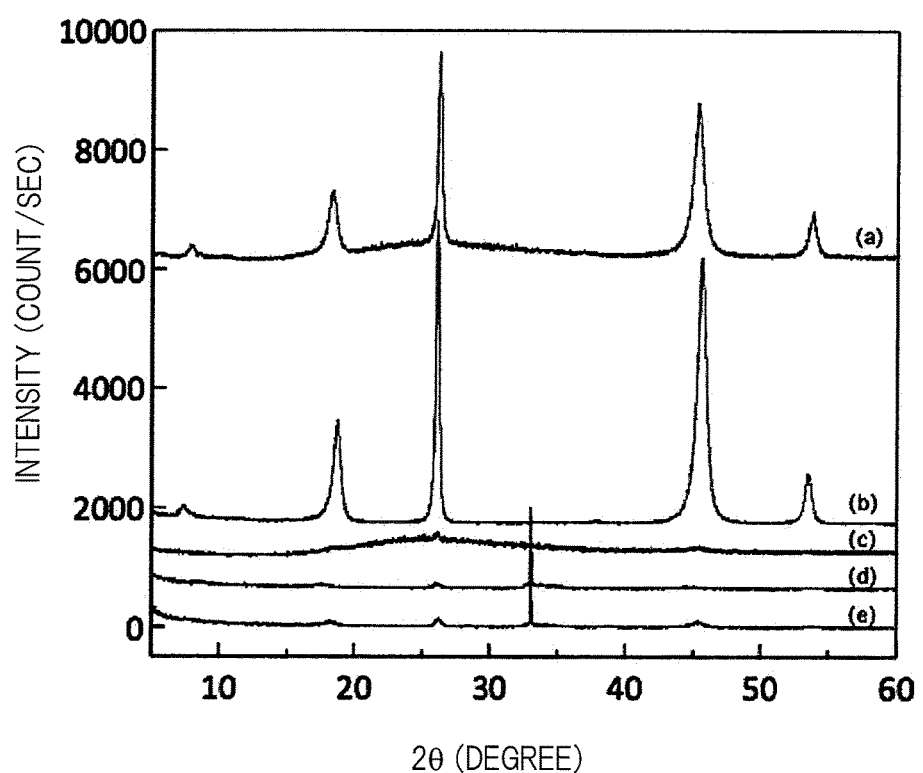
FIG. 6 is a view showing results of measurements for a crystalline property of the first crystal orientation layer.

For the crystal orientation layer laminated structure according to Example 1, the crystalline property of the first crystal orientation layer has been measured by using an X-ray diffraction apparatus (made by Rigaku Corporation, UltimaIV). As a result, it has been verified that the first crystal orientation layer is a $Sb_2Te_3$ film having a [001] crystal orientation as seen in a diffraction chart (a) of FIG. 6. Note that FIG. 6 is a diagram showing the measurement results of the crystalline property of the first crystal orientation layer.

Example 2

A crystal orientation layer laminated structure according to Example 2 has been manufactured as similar to the Example 1 except that, in the above-described orientation control layer formation step, a silicon substrate (made by Ryoko Sangyo Corporation, 5-inch one-sided mirror wafer) whose surface is slightly oxidized has been set inside the sputtering apparatus in place of the above-described glass substrate, and except that, before the formation of the orientation control layer, the reverse sputtering has been performed on the surface of the silicon substrate for 110 seconds by using an argon gas so as to remove the surface oxide substance from the silicon substrate.

For the crystal orientation layer laminated structure according to Example 2, the crystalline property of the first crystal orientation layer has been measured by using an X-ray diffraction apparatus. As a result, it has been verified that the first crystal orientation layer is a $Sb_2Te_3$ film having a [001] crystal orientation as seen in a diffraction chart (b) of FIG. 6.

Example 3

A crystal orientation layer laminated structure according to Example 3 has been manufactured as similar to the Example 2 except that, before the formation of the orientation control layer in the above-described orientation control layer formation step, the reverse sputtering has not been performed on the surface of the silicon substrate.

For the crystal orientation layer laminated structure according to Example 3, the crystalline property of the first crystal orientation layer has been measured by using an X-ray diffraction apparatus. As a result, it has been verified that the first crystal orientation layer is a $Sb_2Te_3$ film having a [001] crystal orientation as seen in a diffraction chart (a) of FIG. 6.

Example 4

A crystal orientation layer laminated structure according to Example 4 has been manufactured as similar to the Example 1 except that, in the above-described orientation control layer formation step, an amorphous germanium film has been film-formed as the orientation control layer by using a disc-shaped germanium material having a diameter of 3 inches (made by Mitsubishi Materials Corporation, sputtering target) as a target in place of the silicon material.

For the crystal orientation layer laminated structure according to Example 4, the crystalline property of the first crystal orientation layer has been measured by using an X-ray diffraction apparatus. As a result, it has been verified that the first crystal orientation layer is a $Sb_2Te_3$ film having a [001] crystal orientation as seen in a diffraction chart (a) of FIG. 6.

Example 5

A crystal orientation layer laminated structure according to Example 5 has been manufactured as similar to the Example 1 except that, in the above-described orientation control layer formation step, a crystallized tungsten film has been film-formed as the orientation control layer by using a disc-shaped tungsten material having a diameter of 3 inches (made by Mitsubishi Materials Corporation, sputtering target) as a target in place of the silicon material.

For the crystal orientation layer laminated structure according to Example 5, the crystalline property of the first crystal orientation layer has been measured by using an X-ray diffraction apparatus. As a result, it has been verified that the first crystal orientation layer is a $Sb_2Te_3$ film having a [001] crystal orientation as seen in a diffraction chart (a) of FIG. 6.

Example 6

A crystal orientation layer laminated structure according to Example 6 has been manufactured as similar to the Example 1 except that, in the above-described orientation control layer formation step, a germanium-tungsten alloy film has been film-formed as the orientation control layer by using a disc-shaped germanium-tungsten alloy material having a diameter of 3 inches (made by Mitsubishi Materials Corporation, sputtering target) as a target in place of the silicon material.

For the crystal orientation layer laminated structure according to Example 6, the crystalline property of the first crystal orientation layer has been measured by using an X-ray diffraction apparatus. As a result, it has been verified that the first crystal orientation layer is a $Sb_2Te_3$ film having a [001] crystal orientation as seen in a diffraction chart (a) of FIG. 6.

Comparative Example 1

A crystal orientation layer laminated structure according to Comparative Example 1 has been manufactured as similar to the Example 1 except that, without performing the above-described orientation control layer formation step, the first crystal orientation layer is directly formed on the glass substrate.

For the crystal orientation layer laminated structure according to Comparative Example 1, the crystalline property of the first crystal orientation layer has been measured by using an X-ray diffraction apparatus. As a result, it has been verified that the first crystal orientation layer is a $Sb_2Te_3$ hardly having a crystal orientation as seen in a diffraction chart (c) of FIG. 6.

Comparative Example 2

A crystal orientation layer laminated structure according to Comparative Example 2 has been manufactured as similar to the Example 2 except that, without performing the above-described orientation control layer formation step, the first crystal orientation layer is directly formed on the silicon substrate.

For the crystal orientation layer laminated structure according to Comparative Example 2, the crystalline property of the first crystal orientation layer has been measured by using an X-ray diffraction apparatus. As a result, it has been verified that the first crystal orientation layer is a $Sb_2Te_3$ having no crystalline property as seen in a diffraction chart (d) of FIG. 6.

Comparative Example 3

A crystal orientation layer laminated structure according to Comparative Example 3 has been manufactured as similar to the Example 1 except that, after performing the above-described orientation control layer formation step, the sputtering apparatus has been released to the atmosphere once, that the silicon substrate on which the orientation control layer is formed has been taken out, that the orientation control layer has been exposed to the atmosphere for 90 minutes, and that the first crystal orientation layer formation step has been performed to the silicon substrate in this state.

For the crystal orientation layer laminated structure according to Comparative Example 3, the crystalline property of the first crystal orientation layer has been measured by using an X-ray diffraction apparatus. As a result, it has been verified that the first crystal orientation layer is a $Sb_2Te_3$ having no crystalline property as seen in a diffraction chart (e) of FIG. 6.

Comparative Example 4

A crystal orientation layer laminated structure according to Comparative Example 4 has been manufactured as similar to the Example 1 except that, in the above-described orientation control layer formation step, the thickness of the amorphous silicon film serving as the orientation control layer has been changed from 50 nm to 0.5 nm.

For the crystal orientation layer laminated structure according to Comparative Example 4, the crystalline property of the first crystal orientation layer has been measured by using an X-ray diffraction apparatus. As a result, it has been verified that the first crystal orientation layer is a $Sb_2Te_3$ hardly having a crystal orientation as almost similar to a diffraction chart (c) of FIG. 6.

Comparative Example 5

A crystal orientation layer laminated structure according to Comparative Example 5 has been manufactured as similar to the Example 1 except that, in the above-described orientation control layer formation step, the thickness of the amorphous silicon film serving as the orientation control layer has been changed from 50 nm to 0.8 nm.

For the crystal orientation layer laminated structure according to Comparative Example 5, the crystalline property of the first crystal orientation layer has been measured by using an X-ray diffraction apparatus. As a result, it has been verified that the first crystal orientation layer is a $Sb_2Te_3$ hardly having no crystalline property as seen in a diffraction chart (e) of FIG. 6.

EXPLANATION OF REFERENCE CHARACTERS

1, 101, 201 lower electrode
2, 103, 203 orientation control layer
3 spin current generation layer
4 spin current accumulation layer
5, 108, 208 upper electrode
10, 100, 200 electronic memory
51, 104 first crystal orientation layer
52, 105 second crystal orientation layer
51*a*, 52*a* adjacent surface
102 semiconductor substrate
106*a* to 106*c* recording layer
107 spin injection layer
209 superlattice structure

The invention claimed is:

1. A crystal orientation layer laminated structure comprising:
    a substrate;
    an orientation control layer that is laminated on the substrate and whose thickness is at least 1 nm or more; and
    a first crystal orientation layer that is laminated on the orientation control layer, which includes one or more of SbTe, $Sb_2Te_3$, BiTe, $Bi_2Te_3$, BiSe or $Bi_2Se_3$ as a main component, and which is oriented in a certain crystal orientation
    wherein the orientation control layer is made of a material selected from the group consisting of germanium, silicon, tungsten, germanium-silicon, germanium-tungsten and silicon-tungsten.

2. The crystal orientation layer laminated structure according to claim 1, further comprising:
    a second crystal orientation layer which is laminated on the first crystal orientation layer, which is made of an alloy represented by the following general chemical formula (1), and which is oriented in a certain crystal orientation,
    wherein, in the chemical formula (1), a term "M" represents any atom of Ge, Al and Si, and a term "x" represents a numeric value of 0.5 or more and less than 1,

[Chemical Formula 1]

$$M_{1-x}Te_x \qquad (1).$$

3. The crystal orientation layer laminated structure according to claim 2, wherein the first crystal orientation layer has a crystal structure having a hexagonal crystal system while the second crystal orientation layer has a crystal structure having a cubic crystal system, a c-axis of the first crystal orientation layer is oriented in a laminated layer direction, and a (111) plane of the second crystal orientation layer is oriented on a surface adjacent to the second crystal orientation layer.

4. The crystal orientation layer laminated structure according to claim 1,
wherein the first crystal orientation layer is made of $Sb_2Te_3$ as a main component.

5. The crystal orientation layer laminated structure according to claim 2,
wherein the second crystal orientation layer is made of GeTe as a main component.

6. An electronic memory comprising at least the crystal orientation layer laminated structure according to claim 1.

7. A method for manufacturing a crystal orientation layer laminated structure comprising:

an orientation control layer formation step of film-forming a material selected from the group consisting of germanium, silicon, tungsten, germanium-silicon, germanium-tungsten and silicon-tungsten on a substrate under an inert gas atmosphere so as to form the orientation control layer with a thickness of 1 nm or more; and a first crystal orientation layer formation step of film-forming a film-forming material including one or more of SbTe, $Sb_2Te_3$, BiTe, $Bi_2Te_3$, BiSe or $Bi_2Se_3$, on the orientation control layer while maintaining the inert gas atmosphere in the orientation control layer formation step, so as to form a first crystal orientation layer which is oriented in a certain crystal orientation.

8. The method for manufacturing a crystal orientation layer laminated structure according to claim 7,
wherein the first crystal orientation layer formation step is a step of film-forming $Sb_2Te_3$ in a state in which the orientation control layer is heated at 150° C. or higher and less than 300° C. so as to form the first crystal orientation layer.

* * * * *